United States Patent
Borowski et al.

(10) Patent No.: US 7,194,046 B2
(45) Date of Patent: Mar. 20, 2007

(54) FREQUENCY ERROR CORRECTION UNIT AND METHOD IN A WIRELESS LAN SYSTEM

(75) Inventors: Jörg Borowski, Dresden (DE); Thomas Hanusch, Dresden (DE); Uwe Eckhardt, Dresden (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 761 days.

(21) Appl. No.: 10/184,409

(22) Filed: Jun. 27, 2002

(65) Prior Publication Data

US 2003/0185317 A1    Oct. 2, 2003

(30) Foreign Application Priority Data

Mar. 27, 2002 (DE) ............... 102 13 838

(51) Int. Cl.
*H03D 3/18* (2006.01)
(52) U.S. Cl. .............. 375/327; 375/344; 375/376; 455/192.2
(58) Field of Classification Search .......... 375/326, 375/327, 344, 134, 137, 376, 375; 455/139, 455/113, 164.1, 164.2, 165.1, 173.1, 182.1, 455/182.2, 182.3, 255, 256, 192.2
See application file for complete search history.

(56) References Cited

U.S. PATENT DOCUMENTS

| 5,790,604 | A | * | 8/1998 | Kelton et al. ............... 375/344 |
| 5,848,104 | A | | 12/1998 | Ishizu |
| 5,940,744 | A | * | 8/1999 | Uda ............................. 455/75 |
| 5,943,325 | A | * | 8/1999 | Hadar et al. ................. 370/324 |
| 6,134,260 | A | * | 10/2000 | Bottomley et al. .......... 375/130 |
| 2002/0101840 | A1 | * | 8/2002 | Davidsson et al. .......... 370/330 |
| 2004/0081205 | A1 | * | 4/2004 | Coulson ....................... 370/503 |

FOREIGN PATENT DOCUMENTS

EP    0645917    9/1994

OTHER PUBLICATIONS

Translation of Official Communication, Application No. 102 13 838.9-42, Sep. 13, 2005.

* cited by examiner

*Primary Examiner*—Temesghen Ghebretinsae
(74) *Attorney, Agent, or Firm*—Meyertons Hood Kivlin Kowert & Goetzel, P.C.; B. Noël Kivlin

(57) ABSTRACT

A receiving unit in a communication system for receiving a communication signal. The receiving unit is preferably a wireless local area network (WLAN) receiver. The receiving unit comprises a synchronization data detection section and a frequency error correction section. The synchronization data detection section detects predefined synchronization data included in the received communication signal and computes an initial estimate of a frequency error of the received communication signal. The frequency error correction section corrects the frequency of the received communication signal based on frequency error estimates. An initial frequency error estimate used for a first frequency error correction is received from said synchronization data detection.

15 Claims, 5 Drawing Sheets approx error for PDT ferr-approximation (Q-I)/(Q+I); I=0,5 approx error for PDT ferr-approximation (Q-I)/2; I=0,5

FREQUENCY ERROR CORRECTION UNIT AND METHOD IN A WIRELESS LAN SYSTEM

BACKGROUND OF THE INVENTION

1. Field of the Invention

The invention generally relates to a frequency error correction unit and method, and in particular to a receiver in a wireless local area network (WLAN) communication system.

2. Description of the Related Art

In a communication system, it is important for a receiver to synchronize to the transmitter so that messages can successfully be exchanged between the transmitter and the receiver. In a radio communication system, it is particularly important that a receiver is tuned to the frequency of the transmitter for optimal reception.

A wireless local area network is a flexible data communication system implemented as an extension to or as an alternative for a wired LAN. WLAN systems transmit and receive data over the air using radio frequency or infrared technology to minimize the need for wired connections. Thus WLAN systems combine data connectivity with user mobility.

Today most WLAN systems use spread spectrum technology, a wide-band radio frequency technique developed for use in a reliable and secure communication systems. The spread spectrum technology is designed to trade-off bandwidth efficiency for reliability, integrity and security. Two types of spread spectrum radio systems are frequently used: frequency hopping and direct sequence systems.

In direct sequence spread spectrum systems, spreading is achieved by encoding each data bit using a code word or symbol that has a much higher frequency and information bit rate. The resultant "spreading" of the signal across a wider frequency bandwidth results in a comparatively lower power spectrum density, so that other communication systems are less likely to suffer interference from the device that transmits the direct sequence spread spectrum signal. Direct sequence spread spectrum employs a pseudo random noise code word known to the transmitter and receiver to spread the data. The code word consists of a sequence of "chips" that are multiplied by (or exclusive-ORed) with the information bits to be transmitted. Many wireless networks conform the IEEE 802.11 standard which employs the well-known Barker code to encode and spread the data. The Barker code word consists of a predefined sequence of eleven chips. One entire Barker code word sequence is transmitted in the time period occupied by an information-containing symbol.

To allow higher data rate transmissions, the IEEE 802.11 standard was extended to IEEE 802.11b. In addition to the 11-bit Barker chips, the 802.11b standard uses an 8-bit complementary code keying (CCK) algorithm for high data rate transmission.

The data transfer rate may also be improved above the symbol rate by employing higher order modulation techniques, including quadrature phase-shift keying (QPSK) modulation. According to such modulation techniques, each bit is represented by a higher number of possible phases. The transmitter therefore generates two signals, the first signal called the "in-phase" (I) signal or "I channel" and a second signal called the "quadrature" (Q) signal or "Q channel" for a 90° phase-shifted sinusoidal carrier at the same frequency.

The IEEE 802.11 standard for wireless LANs using direct sequence spread spectrum techniques employ a training preamble to train a receiver to a transmitter. Each transmitted data message comprises an initial training preamble followed by a data field. The preamble includes a sync field to insure that the receiver can perform the necessary operations for synchronization. For the preamble length, two options have been defined, namely a long and a short preamble. All compliant 802.11b systems have to support the long preamble. The short preamble option is provided in the standard to improve the efficiency of the networks throughput when transmitting special data such as voice and video. The synchronization field of a preamble consists of 128 bits for a long preamble and 56 bits for a short preamble.

A receiver detects the synchronization symbols and lines the receivers internal clock to the symbols in the synchronization field in order to establish a fixed reference time frame with which to interpret the fields in the transmission frame structure following the preamble. The preamble, including the synchronization field, is transmitted at the start of every message (data packet).

When operating a wireless LAN receiver, code synchronization is necessary because the code is a key to despreading the desired information. A good synchronization is achieved when the coded signal arriving at the receiver is accurately timed in both its code pattern position and its rate of chip generation.

The oscillators in a receiver and a transmitter may provide different frequencies due to manufacturing imperfections, different temperatures etc. which result in a frequency drift of the baseband signal. Such frequency differences or frequency offsets are corrected by frequency error correction units at the receiver's site.

Referring now to FIG. 1, frequency synchronization is acquired by repeatedly obtaining a frequency error estimation and performing a frequency error correction of the input signal based on the obtained frequency error estimation. Such a correction procedure is repeatedly performed in a feedback loop.

A frequency error correction unit performing the frequency error correction as shown in FIG. 1 is described with reference to FIG. 2. The frequency error correction unit is a processing loop used to acquire frequency synchronization for the received signal. The received signal 200 is applied to a mixer 210. The output of mixer 210 is fed to a frequency error detector in order to compute the frequency error. The output of the frequency error detector 230 is processed through a loop filter 240 having a predefined filter function and a numerically controlled oscillator (NCO) 250. The output of the numerically controlled oscillator (NCO) is also applied to the mixer 210 to complete the frequency loop to correct for the detected frequency error.

Frequency error correction units still have a number of problems. One problem is that frequency error correction units need a time consuming number of iterative steps to achieve frequency synchronization between the receiver's clock and the input signal. Further, a first frequency error correction is only possible after completing the feedback loop.

SUMMARY OF THE INVENTION

An improved frequency error correction is provided that enables a faster acquisition of frequency synchronization.

In one embodiment, a frequency error correction unit is provided for correcting the frequency of a received communication signal based on a detected frequency error of the communication signal. The frequency error correction unit has a first input terminal for receiving the communication signal, a second input terminal for receiving an initial frequency error estimate, and a third input terminal for receiving following frequency error estimates. An output terminal of the frequency error correction unit provides a frequency corrected communication signal, wherein a first frequency error correction of the input signal being performed based on the initial frequency error estimate.

In another embodiment, a receiving unit is provided in a communication signal for receiving a communication signal which includes predefined synchronization data. The receiving unit comprises a synchronization data detection section and a frequency error correction section. The synchronization data detection section detects the predefined synchronization data in the received communication signal and computes an initial estimate for the frequency error of the communication signal. The frequency error correction section corrects the frequency of the received communication signal based on frequency error estimates, wherein an initial frequency error estimate is received from the synchronization data detection section.

In a further embodiment, a frequency error correction method is provided in a communication system for correcting the frequency of a received communication signal which includes predefined synchronization data. An initial frequency error estimate of the received communication signal is obtained during detection of the predefined synchronization data. Based on the acquired initial frequency error estimate, an initial correction of the frequency of the received communication signal is carried out. Subsequently, a feedback frequency error estimate is received and a frequency error correction is performed accordingly.

In a further embodiment, a method of receiving a communication signal in a communication system is provided. The communication signal includes predefined synchronization data. After receiving the communication signal, an initial frequency error estimate is computed during detecting the predefined synchronization data in the received communication signal. A first correction of the frequency of the received communication signal is carried out based on the initial frequency error estimate. Subsequently, feedback frequency error estimates are obtained and a frequency error correction is performed accordingly.

BRIEF DESCRIPTION OF THE DRAWINGS

The accompanying drawings are incorporated into and form a part of the specification for the purpose of explaining the principles of the invention. The drawings are not to be construed as limiting the invention to only the illustrated and described examples of how the invention can be made and used. Further features and advantages will become apparent from the following and more particular description of the invention, as illustrated in the accompanying drawings, wherein.

DETAILED DESCRIPTION OF THE INVENTION

The illustrative embodiments of the present invention will be described with reference to the figure drawings.

Figure 3:
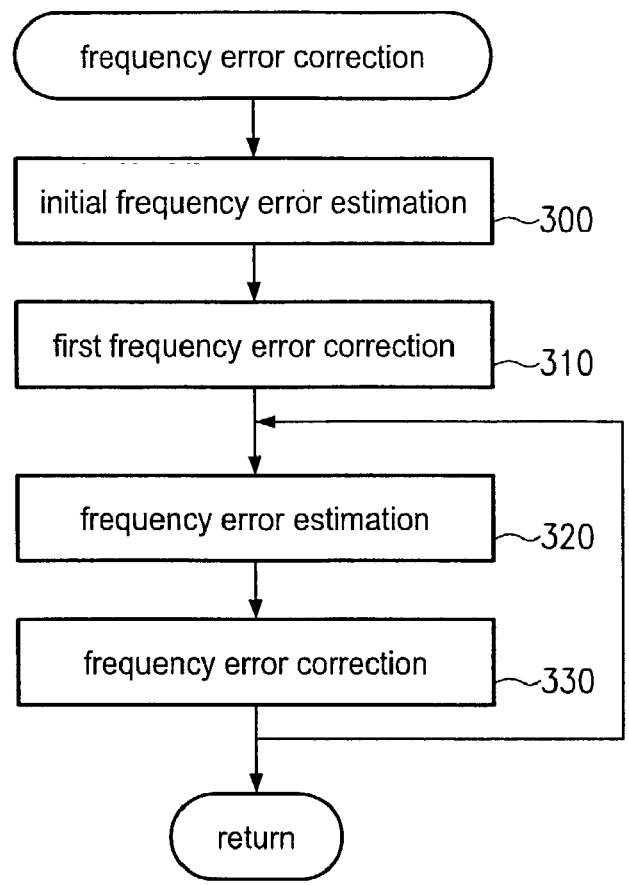
FIG. 3 is a flowchart illustrating the process of correcting a frequency error in a received communication signal.

Referring now to the drawings and in particular to FIG. 3, which illustrates a processing sequence for frequency error correction as described herein. First, an initial frequency error estimate is obtained from a received communication signal in a step 300. Based on the initial frequency error estimate, the incoming communication signal is subjected to a first frequency error correction in step 310. The initial frequency error estimation provides a frequency error estimate for initialization of the frequency error correction unit. This processing scheme may advantageously result in a shortening of the subsequent conventional frequency error correction procedure as the number of iterative steps for synchronizing the frequency of the received communication signal and the receivers frequency may be reduced due to an initially corrected communication signal frequency.

After the first frequency error correction, the frequency of the incoming communication signal is synchronized in a closed loop comprising the steps of estimating a frequency error of the frequency corrected communication signal (step 320) and correcting the frequency of the incoming communication signal (step 330). By providing an initial frequency error estimation and correction (step 300, 310), frequency synchronization may be acquired employing a smaller number of correction amendments and a shorter period of time.

Figure 4:
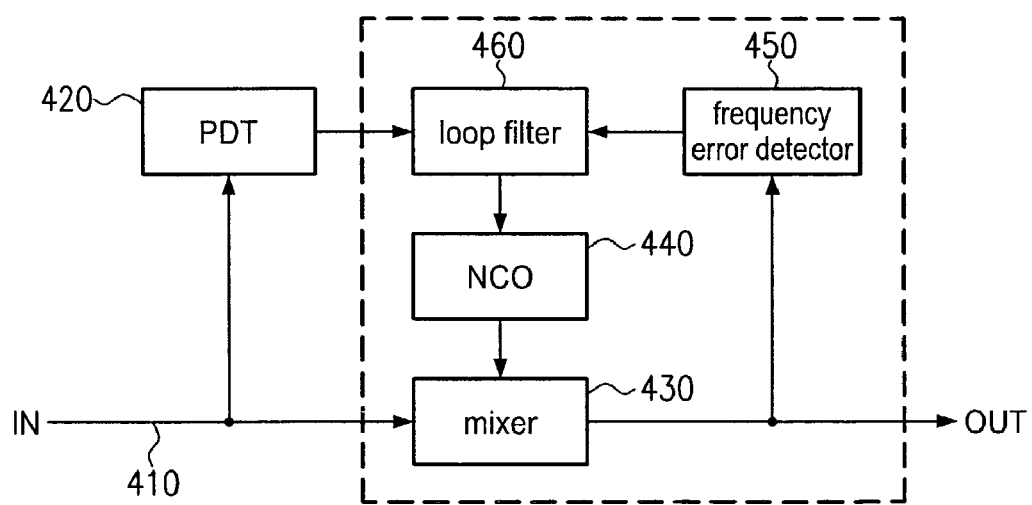
FIG. 4 is a block diagram illustrating the components of a frequency error correction unit incorporated into a receiving unit of a communication system.

A receiver's architecture for carrying out the above procedure to acquire frequency synchronization is shown in detail in the block diagram of FIG. 4. The received communication signal 410 is applied to a synchronization data detector 420 and to a mixer 430. The mixer 430 is additionally fed by the output of a numerically controlled oscillator (NCO) 440. The frequency corrected output signal of the mixer 430 is applied to a frequency error detector 450 for frequency error estimation. Frequency error estimates either received from synchronization unit 420 or from frequency error detector 450 are applied to a loop filter 460. The loop filter 460 selects one of the measured frequency error estimates which are in turn applied to the numerically controlled oscillator (NCO) 440 to complete the frequency loop to correct for the detected frequency error.

The process of acquiring frequency synchronization will now be described with reference to the block diagram of FIG. 4. Each transmitted data message of the incoming communication signal comprises an initial training preamble. The preamble, including a 128 or 56 symbol synchronization field, is transmitted by employing a modulation scheme in which the I channel and the Q channel contain the information. The receiver detects these synchronization symbols and aligns the receivers internal clock to the symbols in the synchronization field in order to establish a fixed reference time frame with which to interpret the fields following the synchronization field. A wireless LAN IEEE frame is first detected by synchronization unit 420, in particular a preamble detector (PDT). The preamble detection unit 420 also provides an estimation of the frequency error between the local oscillators in the transmitter and receiver, leading to a frequency error between the transmitted and the received communication signal. The initial frequency estimate may be calculated based on predefined approximations which will be outlined in more detail below.

The frequency error estimate is then processed through loop filter 460 having a predefined filter function and through numerically controlled oscillator (NCO) 440. The mixer 430 is coupled to receive the incoming communication signal 410 to be frequency corrected and is coupled to the numerically controlled oscillator 440 to control the operation of mixer 430. Mixer 430 subjects the received communication signal to a frequency correction in accordance with the received signal provided by the numerically controlled oscillator 440.

Figure 1:
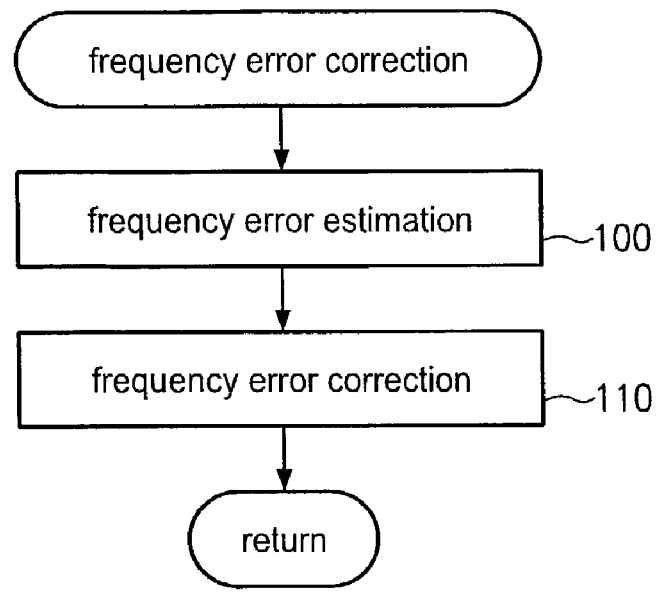
FIG. 1 is a flowchart illustrating a frequency error correction procedure.
Figure 2:
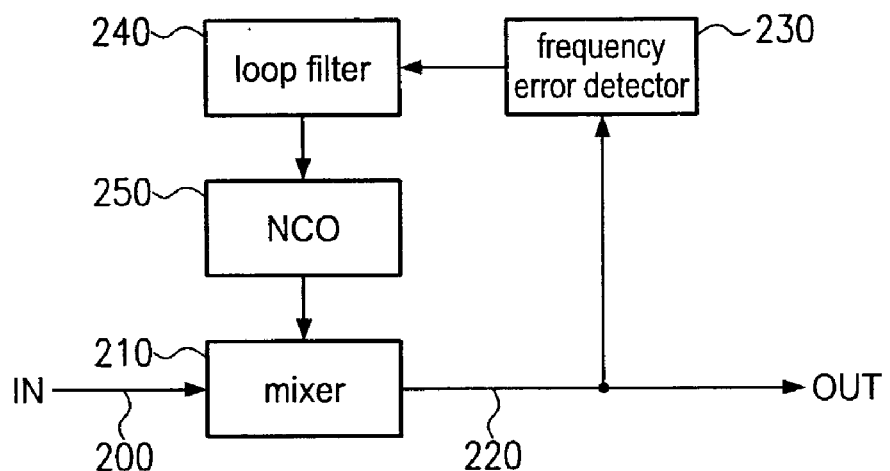
FIG. 2 is a block diagram illustrating the components of a frequency error correction unit.

After the initial frequency error correction, the frequency synchronization loop is formed by frequency error estimation unit 450 receiving the feedback output from mixer 430, loop filter 460, numerically controlled oscillator 440 and mixer 430 to complete the loop. The synchronization operation corresponds to the frequency error estimation and correction procedure described in connection with FIG. 2.

The arrangement as described above may advantageously improve conventional wireless LAN receivers in that the frequency synchronization is shortened, in particular by obtaining a first frequency error estimate which is provided to the synchronization loop from a separate processing section located upstream of the conventional communication signal frequency synchronization processing. The initially obtained frequency estimate will be immediately used as an initialization value in the frequency error correction unit thereby accelerating the synchronization procedure.

Figure 5:
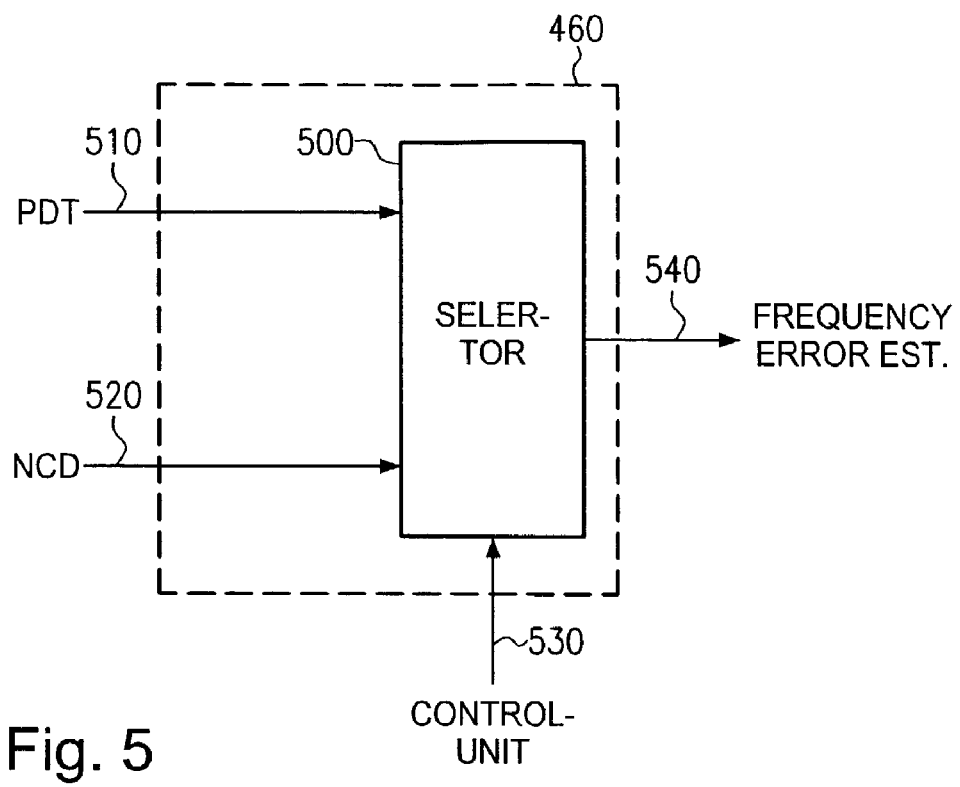
FIG. 5 is a block diagram illustrating a part of a loop filter module configuration which is shown in the configuration of the frequency error correction unit of FIG. 4.

FIG. 5 is a more detailed block diagram of a portion of loop filter 460 in accordance with one embodiment of the present invention. Loop filter 460 receives frequency error estimates from two different sources, namely an initial frequency error estimate from an external source and following frequency error estimates provided on a feedback path. In order to select the appropriate frequency estimate for controlling the frequency error correction of the incoming communication signal, loop filter 460 comprises a selector 500.

Selector 500 is coupled to an external source, e.g. preamble detector 420 according to a preferred embodiment of the present invention, for receiving an initial frequency error estimate. Further, selector 500 is coupled to frequency error detection unit 450 located in the feedback path for receiving subsequent frequency error estimates. In addition, selector 500 is coupled to a control unit (not shown) providing a signal for selecting the appropriate source for a current frequency error estimate. Depending on the received control signal 530, selector 500 outputs an appropriate frequency error estimate which is applied to the numerically controlled oscillator 440. During an initial phase, selector 500 provides the initial frequency error estimate received from the preamble detector after a preamble of a transmission frame has been detected. Thereafter, the frequency error signal generated by the frequency error detector 450 is applied to the numerically controlled oscillator 440.

Figure 6:
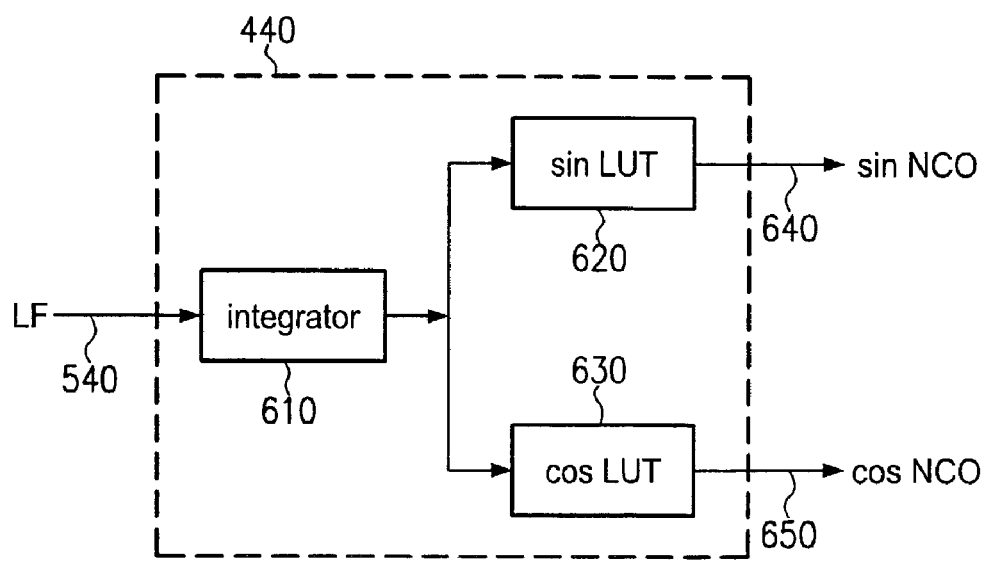
FIG. 6 is a block diagram illustrating a configuration of a numerically controlled oscillator module incorporated in the configuration shown in FIG. 4.

Referring to FIG. 6, an exemplary embodiment of a numerically controlled oscillator module (NCO) 440 is shown. The input signal 540 of the numerically controlled oscillator received from loop filter 460 is forwarded to an integrator 610. Integrator 610 may be configured to add its delayed feedback output signal to its received input signal 540. The integrator's output is coupled to look up table means 620, 630 for providing complex output signals 640, 650 which are applied to the mixer 430.

Figure 7:
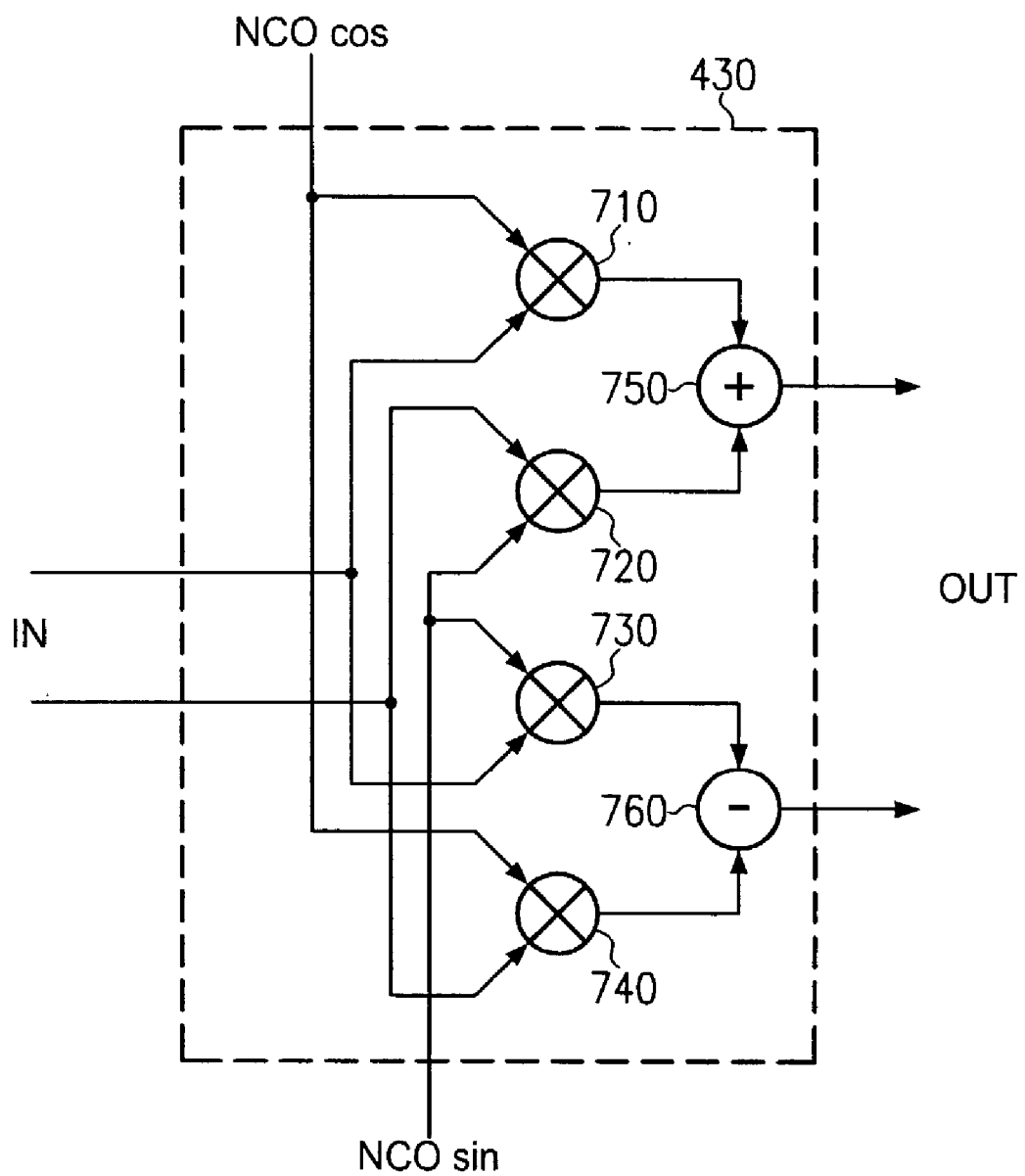
FIG. 7 is a block diagram illustrating a configuration of a mixer module as shown in the configuration of FIG. 4.

Referring to FIG. 7, an exemplary embodiment of mixer 430 is shown. The mixer 430 subjects the received complex communication signal to a frequency correction and outputs a complex frequency corrected signal. As shown in FIG. 7, the complex communication signal is multiplied with the complex signal generated by the numerically controlled oscillator 440. Specifically, each incoming sample of the complex input signal is multiplied with the conjugate complex value received from the numerically controlled oscillator. Each of the input signals is respectively coupled to one of four multipliers 710, 720, 730, 740 in such a manner that each of the multipliers is connected to one component of the input complex communication signal and one component of the complex correction signal.

The output signal of mixer 430 is further processed in the wireless LAN receiver by additional processing modules (not shown) and, at the same time, feedback for frequency error estimation and correction.

According to a one embodiment, the frequency error estimate is computed during preamble detection in the preamble detector 420. The preamble detector provides as output signals a preamble detection signal and an initial estimate of a frequency error.

The additional task of the preamble detector to provide an initial frequency error estimation may not result in a hardware configuration with considerably increased complexity as the signal components required for obtaining a first frequency estimate are available from the preamble detection operation itself.

The preamble detector measures a phase difference error of the received communication signal, i.e. the rotation angle of the received and differentially demodulated communication signal against the ideal constellation:

A phase difference error as a typical approximation for the frequency error may be computed based on the following equation:

$$\Delta\varphi_{err} = \arctan\frac{Q-I}{Q+I} \text{ for } \frac{Q}{I} > -1 (\Delta\varphi_{err} < -\frac{\pi}{4})$$

wherein Q and I correspond to the complex components after applying differential demodulation to the received communication signal inside the preamble detector.

The result of the above equation may be approximated by employing for instance one the following two approximation approaches. The first of the described approximation is based on the assumption that:

arc tan x≈x

Based on this assumption, the phase difference computation may be approximated as follows:

$$\Delta\varphi_{err} \approx \frac{Q-I}{Q+I}$$

This kind of approximation for the phase difference calculation is preferably used when a division operation is available in the employed hardware configuration.

For the second approximation approach, it is assumed that the power normalization of the receiving unit is working properly. Under such a condition, the following assumptions are valid:

$$Q \approx Q_o \approx 1$$

$$I \approx I_o \approx 1$$

Based on these assumptions, the phase difference may be approximated as follows:

$$\Delta \varphi_{err} \approx \frac{1}{2}(Q - I)$$

This second described approximation calculation may be advantageous as it requires the lowest hardware effort.

Figure 8:
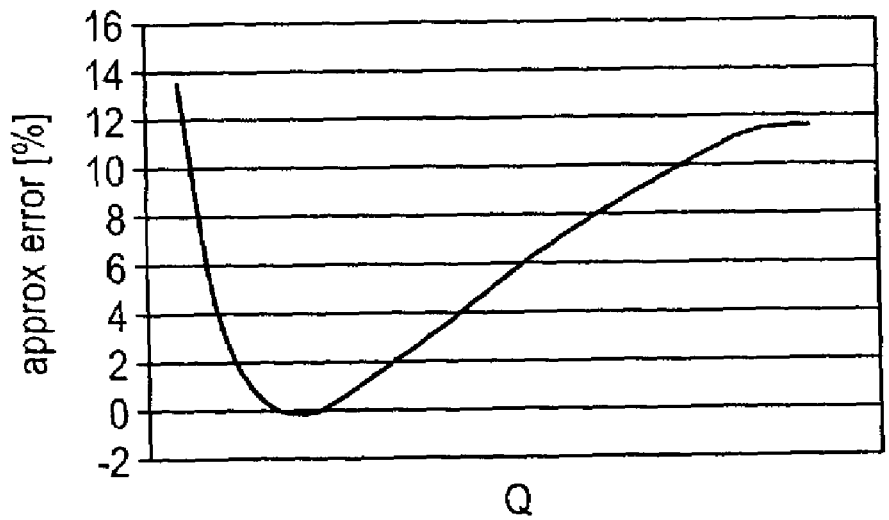
FIG. 8 illustrates an example of an approximation of the frequency error calculation when employing a first approximation rule.
Figure 9:
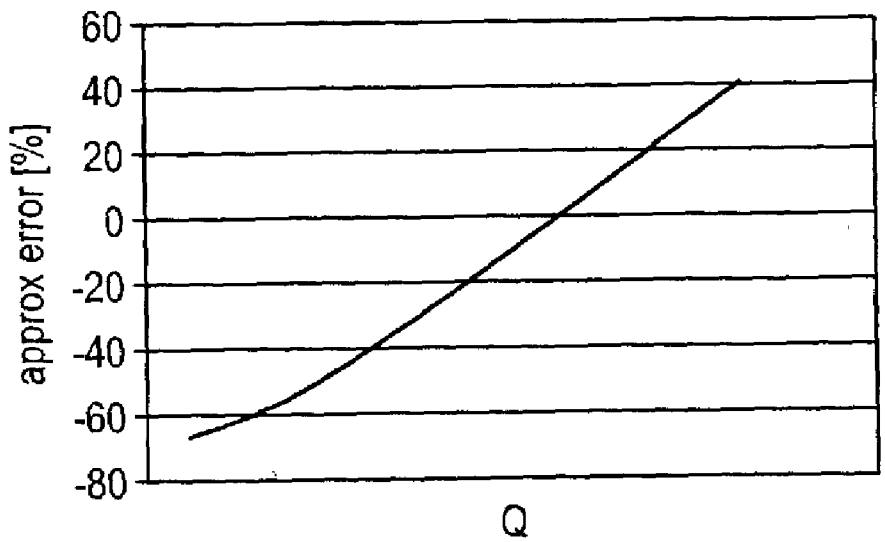
FIG. 9 illustrates an example of an approximation of the frequency error calculation when employing a second approximation rule.

Both above-described approximations result in a different degree of approximation error. The approximation errors resulting from both of the approximation approaches are shown in FIG. 8 and FIG. 9, respectively. As can been seen FIG. 8 and FIG. 9, the amount of approximation error increases when employing the second approximation. Thus, the first phase difference approximation should be selected in case the resulting approximation error exceeds a desired approximation error range.

While the phase difference error detection performed by a preamble detector has been described with respect to the above-mentioned two approximation approaches, it is not limited to these approximation approaches. As those skilled in the art will appreciate, any other approximation or even no approximation may be employed.

While the invention has been described with respect to the physical embodiments constructed in accordance therewith, it will be apparent to those skilled in the art that various modification, variations and improvements of the present invention may be made in the light of the above teachings and within the purview of the appended claims without departing from the spirit and intended scope of the invention. In addition, those areas in which it is believed that those of ordinary skill in the art are familiar, have not been described herein in order to not unnecessarily obscure the invention described herein. Accordingly, it is to be understood that the invention is not to be limited by the specific illustrative embodiments, but only by the scope of the appended claims.

What is claimed is:

1. A receiving unit in a communication system for receiving a communication signal, said communication signal including predefined synchronization data, comprising:
   a synchronization data detection section configured to detect the predefined synchronization data in the received communication signal and configured to compute an initial estimate of a frequency error of the received communication signal, wherein said synchronization data detection section comprises a phase difference error detector configured to determine the initial frequency error estimate; and
   a frequency error correction section configured to correct the frequency of the received communication signal based on frequency error estimates, wherein an initial frequency error estimate is received from said synchronization data detection section, wherein the frequency error estimates following the initial frequency error estimate are obtained from a frequency error detector located in a feedback path of the frequency corrected communication signal.

2. The receiving unit of claim 1, wherein the phase difference error detector determines the initial frequency error estimate based on an approximation calculation.

3. The receiving unit of claim 2, wherein the phase difference $\Delta\phi_{err}$ being approximated from complex signal components I and Q of the received communication signal by employing the following equation:

$$\Delta \varphi_{err} \approx \frac{Q - I}{Q + I}.$$

4. The receiving unit of claim 2, wherein the phase difference $\Delta\phi_{err}$ being approximated from complex signal components I and Q of the received communication signal by employing the following equation:

$$\Delta \varphi_{err} \approx \frac{1}{2}(Q - I).$$

5. The receiving unit of claim 1, wherein an initial frequency error estimate is computed during acquisition of transmission frame synchronization.

6. The receiving unit of claim 1, wherein the receiving unit is a wireless LAN receiver.

7. A frequency error correction method in a communication system for correcting the frequency of a received communication signal, said communication signal including predefined synchronization data, the method comprising the steps of:
   receiving an initial frequency error estimate of the received communication signal obtained during detection of the predefined synchronization data in the received communication signal, wherein said initial frequency error estimate is computed using the predefined synchronization data, wherein the initial frequency error estimate is a phase difference error of the received communication signal;
   initially correcting the frequency of the received communication signal based on the initial frequency error estimate; and
   receiving a feedback frequency error estimate and correcting the frequency of the communication signal accordingly.

8. The frequency error correction method of claim 7, wherein the synchronization data are part of a preamble of a transmission frame included in the communication signal.

9. The frequency error correction method of claim 7, wherein the phase difference error is calculated by employing a phase difference error approximation calculation.

10. The frequency error correction method of claim 9, wherein the phase difference $\Delta\phi_{err}$ being approximated from complex signal components I and Q of the received and differentially demodulated communication signal by employing the following equation:

$$\Delta \varphi_{err} \approx \frac{Q - I}{Q + I}.$$

11. The frequency error correction method of claim 9, wherein the phase difference $\Delta\phi_{err}$ being approximated from complex signal components I and Q of the received and differentially demodulated communication signal by employing the following equation:

$$\Delta \varphi_{err} \approx \frac{1}{2}(Q-I).$$

12. A method of receiving a communication signal in a communication system, the communication signal including predefined synchronization data, the method comprising the steps of:
   receiving the communication signal;
   computing an initial frequency error estimate during detection of the predefined synchronization data in the received communication signal, wherein said initial frequency error estimate is computed using the predefined synchronization data, wherein the initial frequency error estimate is a phase difference error of the received communication signal;
   correcting the frequency of the received communication signal based on the initial frequency error estimate;
   obtaining a feedback frequency error estimate of the frequency corrected communication signal and correcting the frequency of the received communication signal accordingly.

13. The method of claim 12, wherein the communication system is a wireless LAN communication system.

14. A receiving unit in a communication system for receiving a communication signal, said communication signal including predefined synchronization data, comprising:
   a synchronization data detection section configured to detect the predefined synchronization data in the received communication signal and configured to compute an initial estimate of a frequency error of the received communication signal, wherein said synchronization data detection section comprises a phase difference error detector configured to determine the initial frequency error estimate; and
   a frequency error correction section configured to correct the frequency of the received communication signal based on frequency error estimates, wherein an initial frequency error estimate is received from said synchronization data detection section;
   wherein the phase difference error detector determines the initial frequency error estimate based on an approximation calculation, the phase difference $\Delta \phi_{err}$ being approximated from complex signal components I and Q of the received communication signal by employing the following equation:

$$\Delta \varphi_{err} \approx \frac{Q-I}{Q+I}.$$

15. A receiving unit in a communication system for receiving a communication signal, said communication signal including predefined synchronization data, comprising:
   a synchronization data detection section configured to detect the predefined synchronization data in the received communication signal and configured to compute an initial estimate of a frequency error of the received communication signal, wherein said synchronization data detection section comprises a phase difference error detector configured to determine the initial frequency error estimate; and
   a frequency error correction section configured to correct the frequency of the received communication signal based on frequency error estimates, wherein an initial frequency error estimate is received from said synchronization data detection section;
   wherein the phase difference error detector determines the initial frequency error estimate based on an approximation calculation, the phase difference $\Delta \phi_{err}$ being approximated from complex signal components I and Q of the received communication signal by employing the following equation:

$$\Delta \varphi_{err} \approx \frac{1}{2}(Q-I).$$

* * * * *